United States Patent
Naruse et al.

(10) Patent No.: US 7,531,243 B2
(45) Date of Patent: *May 12, 2009

(54) GAS BARRIER LAMINATE FILM AND PRODUCTION METHOD THEREFOR AS WELL AS SUBSTRATE AND IMAGE DISPLAY DEVICE UTILIZING THE FILM

(75) Inventors: Hideaki Naruse, Minami-ashigara (JP); Hiroshi Iwanaga, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 636 days.

This patent is subject to a terminal disclaimer.

(21) Appl. No.: 10/806,421

(22) Filed: Mar. 23, 2004

(65) Prior Publication Data

US 2004/0219380 A1 Nov. 4, 2004

(30) Foreign Application Priority Data

Mar. 31, 2003 (JP) .............................. 2003-093738

(51) Int. Cl.
*B32B 9/04* (2006.01)
*H01J 1/62* (2006.01)
*C09K 11/06* (2006.01)

(52) U.S. Cl. .................... 428/500; 428/411.1; 428/690; 428/917; 428/141; 428/150; 428/331; 428/332; 428/338; 257/40; 257/100; 313/512

(58) Field of Classification Search .................. 428/323, 428/690, 411.1, 500, 338, 331, 332, 149, 428/150, 917; 257/40, 100; 313/512
See application file for complete search history.

(56) References Cited

U.S. PATENT DOCUMENTS

| 5,766,751 A * | 6/1998 | Kotani et al. ................. 428/323 |
| 6,638,645 B2 * | 10/2003 | Sawai et al. ................. 428/690 |
| 7,341,782 B2 * | 3/2008 | Naruse et al. ............ 428/411.1 |
| 2004/0058157 A1 * | 3/2004 | Ishikawa .................. 428/411.1 |
| 2004/0209090 A1 * | 10/2004 | Iwanaga ..................... 428/447 |

FOREIGN PATENT DOCUMENTS

| JP | 2002-060525 | 2/2002 |
| JP | 2003-011262 | 1/2003 |

* cited by examiner

*Primary Examiner*—D. Lawrence Tarazano
*Assistant Examiner*—Camie S Thompson
(74) *Attorney, Agent, or Firm*—Sughrue Mion, PLLC

(57) ABSTRACT

Disclosed is a gas barrier laminate film comprising a base material film and at least one gas barrier layer obtained by a sol-gel method, wherein a difference between oxygen transmission rate at 25° C. in relative humidity of 10% and oxygen transmission rate at 25° C. in relative humidity of 90% is within the range of 0 to $1.0 \times 10^{-5}$ ml/m²·day·Pa. Substrates and image display devices utilizing the gas barrier laminate film show superior gas barrier property even in high humidity, and therefore they show high precision and high durability.

18 Claims, No Drawings

GAS BARRIER LAMINATE FILM AND PRODUCTION METHOD THEREFOR AS WELL AS SUBSTRATE AND IMAGE DISPLAY DEVICE UTILIZING THE FILM

BACKGROUND OF THE INVENTION

1. Field of the Invention

The present invention relates to a transparent gas barrier laminate film having both of superior heat resistance and superior gas barrier property, a substrate utilizing the gas barrier laminate film and an image display device such as an organic electroluminescence device (henceforth referred to as an "organic EL device") and liquid crystal display device utilizing the gas barrier laminate film. In particular, the present invention relates to a substrate and image display device utilizing a flexible support.

2. Description of the Background

With the wide spread of personal computers and portable information terminals, the demand for a thin and light electronic display is rapidly increasing. Currently, glass substrates are mainly used in the liquid crystal display devices, which are most widely spread, and in the organic EL devices, which draw attentions because of their high visibility due to the self-coloring property. In view of production of lighter devices, impact resistance, flexibility and so forth, it is preferred that flexible plastic substrates are used as substrates of liquid crystal devices and organic EL devices. However, plastic substrates have poorer heat resistance and gas barrier property compared with glass substrates. Therefore, they suffer from disadvantages that they are unsuitable for production of highly precise patterns and that their durability is poor.

Many researches to improve such drawbacks of plastic substrates have been reported so far. For example, techniques for improving gas barrier property have been reported in the following patent documents.

Japanese Patent Laid-open Publication (Kokai) No. 2001-205743 (page 3, [0012] to page 10, [0062]) discloses an example of use of a plastic substrate having a multilayer structure constituted by layers comprising layered compounds in a liquid crystal display device. This patent document describes that heat resistance, hardness and anti-gas permeability are improved by the use of the layered compounds. However, the gas barrier property described therein cannot be considered sufficient, and further improvement is required.

Japanese Patent Laid-open Publication No. 7-251489 (page 3, [0005] to page 8, [0034]) discloses a laminated film provided with a layer of a composition comprising a layered inorganic compound having a specific aspect ratio and a resin between layers of polyolefin type resin in order to reconcile moisture proofing property and oxygen barrier property.

Japanese Patent Laid-open Publication No. 2000-343659 (page 2, [0010] to page 7, [0058]) discloses a film having a gas barrier layer comprising a mixture of partial hydrolysate of alkoxide condensate and a water-soluble polymer. However, all of these could not yet provide sufficient oxygen barrier property in high humidity, and the gas barrier property of the whole laminated films needs to be further improved for use in liquid crystal display substrates or organic EL substrates.

Further, for improvement of gas barrier property, a method for producing a gas barrier film comprising providing a layer containing a metal alkoxide or a hydrolysate thereof and then irradiating the layer with an electromagnetic wave to produce a gas barrier film. See, for example, Japanese Patent Laid-open Publication No. 2000-313087 (page 3, [0020] to page 4, [0027]). However, a sufficiently dense film cannot be obtained with a metal alkoxide alone or condensate of metal alkoxide containing a silane coupling agent, and the gas barrier property cannot be considered sufficient for, in particular, use in electronic circuits and display materials.

SUMMARY OF THE INVENTION

The present invention was accomplished in view of the aforementioned problems. The first object of the present invention is to provide a gas barrier laminate film having superior gas barrier property. The second object of the present invention is to provide a highly precise and highly durable substrate and image display device utilizing such a gas barrier laminate film.

The inventors of the present invention conducted various researches to obtain favorable gas barrier property by utilizing characteristics of electromagnetic waves, and as a result, they accomplished the present invention.

That is, the objects of the present invention are achieved by the following gas barrier laminate film, substrate and image display device.

(1) A gas barrier laminate film comprising a base material film and at least one gas barrier layer obtained by a sol-gel method, a difference between oxygen transmission rate at 25° C. in relative humidity of 10% and oxygen transmission rate at 25° C. in relative humidity of 90% is within the range of 0 to $1.0 \times 10^{-5}$ ml/m²·day·Pa.

(2) The gas barrier laminate film according to (1), wherein the gas barrier layer is an organic/inorganic hybrid layer.

(3) The gas barrier laminate film according to (1) or (2), wherein the base material film is constituted by a polymer having a glass transition temperature of 130 to 300° C.

(4) The gas barrier laminate film according to any one of (1) to (3), wherein the base material film contains a layered compound.

(5) The gas barrier laminate film according to any one of (1) to (4), wherein the gas barrier layer is formed by using a polymer having a hydrogen bond-forming group.

(6) The gas barrier laminate film according to any one of (1) to (5), which comprises at least one gas barrier layer between at least two base material films.

(7) A substrate containing the gas barrier laminate film according to any one of (1) to (6).

(8) An image display device comprising the gas barrier laminate film according to any one of (1) to (6) or the substrate according to (7).

In the gas barrier laminate film of the present invention, a difference between oxygen transmission rate at 25° C. in relative humidity of 10% and oxygen transmission rate at 25° C. in relative humidity of 90% is within the range of 0 to $1.0 \times 10^{-5}$ ml/m²·day·Pa. Since the gas barrier laminate film of the present invention shows superior gas barrier property, in particular, in high humidity, the substrate and image display device utilizing the gas barrier laminate film enable formation of highly precise patterns even in high humidity.

The objects of the present invention are also achieved by the following production method.

(1) A method for producing a gas barrier laminate film, which comprises applying a solution containing at least one kind of metal alkoxide and a polymer having a hydrogen bond-forming group on a base material film and irradiating the solution with an electromagnetic wave to form a gas barrier layer.

(2) The production method according to (1), wherein the electromagnetic wave is irradiated during a period immediately after completion of the application of the solution and before completion of drying of the solution.

(3) A method for producing a gas barrier laminate film, which comprises bonding gas barrier layers of gas barrier laminate films obtained by the production method according to (1) or (2) to each other to form a gas barrier laminate film.
(4) The production method according to any one of (1) to (3), wherein an alkoxysilane is used as the metal alkoxide.
(5) The production method according to any one of (1) to (4), wherein at least one kind of electromagnetic wave selected from the group consisting of electron rays, ionic rays and low temperature plasmas is used as the electromagnetic wave.
(6) The production method according to any one of (1) to (5), wherein a microwave is used as the electromagnetic wave.
(7) The production method according to any one of (1) to (6), wherein the electromagnetic wave is irradiated for 5 seconds to 3 minutes immediately after the application of the solution.

The method for producing a gas barrier laminate film of the present invention comprises applying a solution containing at least one kind of metal alkoxide and a polymer having a hydrogen bond-forming group on a base material film and then irradiating the solution with an electromagnetic wave. With these steps, the production method of the present invention enables formation of a dense organic/inorganic hybrid layer having superior gas barrier property utilizing characteristics of the electromagnetic wave. In particular, a gas barrier laminate film produced by the production method of the present invention can exhibit superior gas barrier ability even in high humidity.

BEST MODE FOR CARRYING OUT THE INVENTION

Hereafter, the gas barrier laminate film of the present invention (also referred to as the "laminate film" hereinafter), production method therefor as well as substrate and image display device utilizing the gas barrier laminate film will be explained in more detail.

In the present specification, ranges indicated with "to" mean ranges including the numerical values before and after "to" as the minimum and maximum values.

[Laminate Film of the Present Invention]

The laminate film of the present invention has at least one gas barrier layer obtained by a sol-gel method on a base material film.

<Base Material Film>

The base material film used for the laminate film of the present invention preferably comprises a material having heat resistance so as to be usable for the substrate and image display device described later. It is preferable to use a highly heat-resistant transparent plastic film having a glass transition temperature (Tg) of 100° C. or higher and/or a linear thermal expansion coefficient of 40 ppm/° C. or lower and/or a light transmittance of 80% or more. Tg and linear thermal expansion coefficient of the base material film can be suitably adjusted by controlling types, contents etc. of additives to be contained in the base material film.

The polymer constituting the base material film may be either a thermoplastic polymer or a thermosetting polymer. As for the thermoplastic polymer, preferred is a thermoplastic polymer having Tg of 100 to 400° C., more preferably 130 to 300° C., further preferably 160 to 250° C., as the polymer itself. Further, it is preferably an amorphous polymer in order to obtain optical uniformity.

Examples of such a thermoplastic polymer as described above include, for example, the followings (abbreviations and Tg are shown in the parentheses): polycarbonate (PC, 140° C.), alicyclic polyolefine (e.g., ZEONOA 1600 produced by Nippon Zeon Co., Ltd., 160° C.), polyallylate (PAr, 210° C.), polyethersulfone (PES, 220° C.), polysulfone (PSF, 190° C.), cycloolefin copolymer (COC, the compound of Japanese Patent Laid-open Publication No. 2001-150584, Example 1, 162° C.), polycarbonate having a modified fluorene ring (BCF-PC, the compound of Japanese Patent Laid-open Publication No. 2000-227603, Example 4, 225° C.), polycarbonate having a modified alicylic group (IP-PC, compound of Japanese Patent Laid-open Publication No. 2000-227603, Example 5, 205° C.), and acryloyl compound (the compound of Japanese Patent Laid-open Publication No. 2002-80616, Example 1, 300° C. or higher). When moisture permeability is desired, it is particularly preferable to use an alicyclic polyolefin and so forth.

Further, examples of the thermosetting polymer include epoxy type resins and radiation-curing resins. The epoxy type resins include those of polyphenol type, bisphenol type, halogenated bisphenol type and novolak type. As curing agents for curing epoxy type resins, known curing agents can be used. For example, curing agents of amine type, polyaminoamide type, acid and acid anhydride, imidazole, mercaptan and phenol resin can be mentioned. Among these, acid anhydrides, polymers containing an acid anhydride structure and fatty amines are preferably used in view of solvent resistance, optical characteristics, thermal characteristics etc., and acid anhydrides and polymers containing an acid anhydride structure are particularly preferred. Furthermore, a curing catalyst such as known tertiary amines and imidazole derivatives is preferably added in an optimum amount.

The radiation-curing resins are resins of which curing is advanced by irradiation of radiation such as ultraviolet rays and electron rays, more specifically, resins containing an unsaturated double bond such as those of acryloyl group, methacryloyl group and vinyl group in the molecule or a monomer structure. Among these resins, an acrylic type resin containing acryloyl group is particularly preferably used. Although either one kind of radiation-curing resin may be used, or several kinds of the resins may be mixed and used, it is preferable to use an acrylic type resin having two or more acryloyl groups in the molecule or a unit structure. Examples of such a multi-functional acrylate resin include, for example, urethane acrylate, ester acrylate, epoxy acrylate and so forth. However, it is not limited to these. Acrylate resins containing a unit of the following formula [I] or [II] and having at least two or more acryloyl groups are particularly preferred.

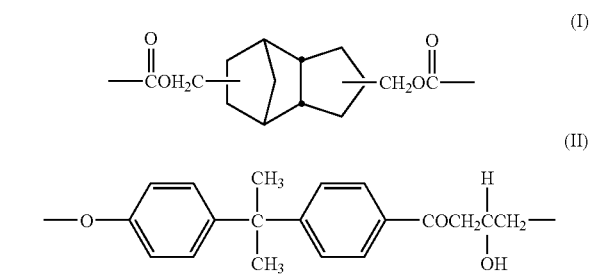

When the ultraviolet curing method is used for these radiation-curing resins, a suitable amount of a known photoreaction initiator is added to the aforementioned radiation-curing resins.

A hydrolysate of an alkoxy silane or silane coupling agent may be mixed in the aforementioned epoxy type resins and radiation-curing resins in order to further strengthen interactions with polymer molecules. As the silane coupling agent, those having a hydrolyzable reactive group such as methoxy group, ethoxy group and acetoxy group on one hand and having epoxy group, vinyl group, amino group, a halogen group or mercapto group on the other hand are preferred. When such compounds are used, in order to fix them to the main component resin, those having vinyl group having the above reactive group are preferred, and for example, KBM-503 and KBM-803 produced by Shin-Etsu Chemical Co., Ltd., A-187 produced by Nippon Unicar Co., Ltd. and so forth are used. These are preferably added in an amount of 0.2 to 3 weight %.

The aforementioned base material film may also contain a layered compound. By adding a layered compound to the base material film, a laminated film of which thermal deformation temperature is improved by 2 to 100° C. compared with a case where the layered compound is not added is favorably obtained.

Although the layered compound is not particularly limited, clay minerals, hydrotalcite compounds and other similar compounds having swelling property and/or cleavage property are preferred.

Examples of such clay minerals includes kaolinite, dickite, nacrite, halloysite, antigorite, chrysotile, pyrophyllite, montmorillonite, beidellite, nontronite, saponite, sauconite, stevensite, hectorite, tetrasilylic mica, sodium taeniolite, muscovite, margarite, talc, vermiculite, phlogopite, xanthophyllite, chlorite and so forth. The aforementioned layered compounds may be either natural substances or synthesized substances. Further, these layered compounds may be used in each kind, or two or more kinds of them may be used together.

Shape of the aforementioned layered compounds is not particularly limited. However, since cleavage of layered compounds having a lot of layers becomes difficult after organofilization thereof with an organophilizing agent, thickness of the layered compound not organophilized is preferably a thickness of one layer (about 1 nm) as far as possible. The average length thereof is 0.01 to 50 µm, preferably 0.05 to 10 µm, and a layered compound having an aspect ratio of 20 to 500, preferably 50 to 200, can be preferably used.

The aforementioned layered compound has ion-exchangeable inorganic cations between layers (including surfaces of uppermost and lowermost layers of inorganic layered compounds). The ion-exchangeable inorganic cations mean metal ions such as those of sodium, potassium and lithium existing on crystal surfaces of the inorganic layered compound (e.g., layered silicate). These ions exhibit a property that they can be exchanged with a cationic substance, and thus various substances having a cationic property can be inserted (intercalated) between the layers of the aforementioned layered compound by an ion exchange reaction.

For exchange of inorganic cations existing between layers of the aforementioned layered compound for organic cations, alkylammonium ions containing a long-chain alkyl group are preferably used as the organic cations. Examples of alkylammonium ions containing a long-chain alkyl group include, for example, tetrabutylammonium ion, tetrahexylammonium ion, dihexyldimethylammonium ion, dioctyldimethylammonium ion, hexyltrimethylammonium ion, octyltrimethylammonium ion, dodecyltrimethylammonium ion, hexadecyltrimethylammonium ion, octadecyltrimethylammonium ion, dioctadecyldimethylammonium ion, docosenyltrimethylammonium ion, hexadecyltrimethylammonium ion, tetradecyldimethylbenzylammonium ion, octadecyldimethylbenzylammonium ion, dioleyldimethylammonium ion, polyoxyethylene dodecylmonomethylammonium ion and so forth.

Although the cation exchange capacity (CEC) of the aforementioned layered compound is not particularly limited, it is, for example, preferably 25 to 200 meq/100 g, more preferably 50 to 150 meq/100 g, further preferably 90 to 130 meq/100 g. If the cation exchange capacity of the layered compound is less than 25 meq/100 g, amount of cationic substance that can be inserted (intercalated) between layers of the layered compound by ion exchange becomes small, and the layers may not be sufficiently organophilized. On the other hand, if the cation exchange capacity exceeds 200 meq/100 g, bonding strength between layers of the layered compound becomes too strong. Thus, cleavage of crystal leaves becomes difficult, and dispersibility may be degraded.

Examples of the layered compound satisfying the aforementioned requirements include, for example, marketed products such as Sumecton SA produced Kunimine Industries, Kunipia F produced by Kunimine Industries, Somasif ME-100 produced by CO-OP Chemical and Lucentite SWN produced by CO-OP Chemical.

As the method for exchanging inorganic cations existing between layers of the aforementioned layered compound for organic cations (organophilization), a wet method is generally used. That is, in the wet method, an inorganic layered compound is sufficiently solvated with water, alcohol or the like, then added with organic cations and stirred so that organic cations should substitute for metal ions existing between layers of the layered compound. Then, unsubstituted organic cations are sufficiently washed off, and the compound is taken by filtration and dried. In addition, it is also possible that the layered compound and organic cations are directly reacted in an organic solvent, or the layered compound and organic cations are reacted by heating and kneading them in the presence of a resin or the like in an extruder.

The mixing ratio of the aforementioned layered compound and the polymer having Tg of 100 to 400° C. is preferably 1/100 to 100/20, more preferably 5/100 to 100/50, in terms of a weight ratio. If the content of the layered compound is less than 1 part by weight with respect to 100 parts by weight of the polymer having Tg of 100 to 400° C., sufficient heat resistance and gas barrier property may not be obtained. On the other hand, if the content of the polymer having Tg of 100 to 400° C. is less than 20 parts by weight with respect to 100 parts by weight of the layered compound, brittleness etc. may be degraded.

When a layer containing the layered compound in the polymer having Tg of 100 to 400° C. is formed, the layered compound and the polymer having Tg of 100 to 400° C. are preferably fusion kneaded or mixed in a solution first to prepare a polymer composition in which the layered compound in a cleaved state is dispersed in the polymer. In view of the production process and cost, they are preferably mixed by the fusion kneading method.

As the fusion kneading apparatus usable for the aforementioned fusion kneading, kneading apparatuses generally used for thermoplastic polymers can be used. For example, a single or multi-screw kneading extruder, roller, Banbury mixer and so forth may be used.

The aforementioned polymer composition can be made into a film by usual the melt-extruding method, calendering method, solution casting method or the like. Further, the obtained film can also be monoaxially or biaxially stretched.

The film surface of the obtained base material film may be subjected to corona discharge treatment, glow discharge treatment, UV treatment, plasma treatment or the like to improve adhesion with the gas barrier layer described later. An anchor layer may also be provided on the film surface.

The laminate film of the present invention is used for image display devices of displays and so forth. Therefore, a transparent base material film, i.e., a base material film having a light transmission of 80% or more, preferably 85% or more, more preferably 90% or more, is preferably used. If the base material film has a light transmission of 80% or more, it can be suitably used as a base material film of organic EL devices described later.

The light transmission used as an index of transparency in this specification can be measured by the method described in JIS-K7105, i.e., by measuring a total light transmission and scattering light amount using an integrating sphere type light transmission measurement apparatus and subtracting the scattering light transmission from the total light transmission.

<Gas Barrier Layer>

The laminate film of the present invention has at least one gas barrier layer obtained by a sol-gel method on the aforementioned base material film. In the laminate film of the present invention, the gas barrier layer is not particularly limited so long as it is obtained by the sol-gel method and exhibits favorable gas barrier performance in high humidity. It is preferably an organic/inorganic hybrid layer obtained by the sol-gel method.

The "organic/inorganic hybrid" referred to in this specification means a state that an inorganic substance and an organic substance is mixed at a molecular level and nano order level, and refers to, for example, composite materials of an organic material and inorganic material obtained by the sol-gel methods described in Adv. Polym. Sci., 100, 11 (1992); Poly. Mater. Encyclopedia, 6, 4793 (1996); and Current Opinion in Solid State & Materials Science, 1, 806 (1996).

The aforementioned gas barrier layer can be obtained by allowing an organic material to coexist with an inorganic material during, before or after a reaction of the inorganic material by using the sol-gel method. In the sol-gel method used for manufacture of the laminate film of the present invention, a metal alkoxide is hydrolyzed and polycondensed preferably in a solution or coated film to obtain a dense thin film. Further, in this operation, a resin (polymer) may also be used together to obtain an organic/inorganic hybrid material.

(Metal Alkoxide)

The metal alkoxide used in the laminate film of the present invention is an inorganic component of the material constituting the gas barrier layer. In view of reactivity, the metal alkoxide is preferably an alkoxysilane. Besides alkoxysilanes, zirconium alkoxides, titanium alkoxides, aluminum alkoxides and so forth are also preferably used. Metal alkoxides may be used in each kind, or two or more kinds of them may be mixed and used.

Alkoxysilanes preferably used in the laminate film of the present invention will be further explained.

Examples of the alkoxysilane include the alkoxysilanes represented by the following formula.

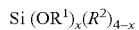

$$Si(OR^1)_x(R^2)_{4-x}$$

In the above formula, $R^1$ preferably represents an alkyl group having 1 to 5 carbon atoms or an acyl group having 1 to 4 carbon atoms. Examples include, for example, methyl group, ethyl group, n-propyl group, isopropyl group, n-butyl group, sec-butyl group, tert-butyl group, acetyl group and so forth. $R^2$ preferably represents an organic group having 1 to 10 carbon atoms. Examples include, for example, an unsubstituted hydrocarbon group such as methyl group, ethyl group, n-propyl group, isopropyl group, n-butyl group, tert-butyl group, n-hexyl group, cyclohexyl group, n-octyl group, tert-octyl group, n-decyl group, phenyl group, vinyl group and allyl group and a substituted hydrocarbon group such as γ-chloropropyl group, $CF_3CH_2-$, $CF_3CH_2CH_2-$, $C_2F_5CH_2CH_2-$, $C_3F_7CH_2CH_2CH_2-$, $CF_3OCH_2CH_2CH_2-$, $C_2F_5OCH_2CH_2CH_2-$, $C_3F_7OCH_2CH_2CH_2-$, $(CF_3)_2CHOCH_2CH_2CH_2-$, $C_4F_9CH_2OCH_2CH_2CH_2-$, 3-(perfluorocyclohexyloxy)propyl group, $(CF_2)_4CH_2OCH_2CH_2CH_2-$, H $(CF_2)_4CH_2CH_2CH_2-$, γ-glycidoxypropyl group, γ-mercaptopropyl group, 3,4-epoxycyclohexylethyl group and γ-methacryloyloxypropyl group. X is preferably an integer of 2 to 4.

Specific examples of these alkoxysilanes are described below.

Examples of the compounds where x=4 include tetramethoxysilane, tetraethoxysilane, tetra-n-propoxysilane, tetraisopropoxysilane, tetra-n-butoxysilane, tetraacetoxysilane and so forth.

Examples of the compounds where x=3 include methyltrimethoxysilane, methyltriethoxysilane, ethyltrimethoxysilane, ethyltriethoxysilane, n-propyltrimethoxysilane, n-propyltriethoxysilane, isopropyltrimethoxysilane, isopropyltriethoxysilane, γ-chloropropyltrimethoxysilane, γ-chloropropyltriethoxysilane, γ-glycidoxypropyltrimethoxysilane, γ-glycidoxypropyltriethoxysilane, γ-methacryloyloxypropyltrimethoxysilane, γ-mercaptopropyltriethoxysilane, phenyltrimethoxysilane, vinyltriethoxysilane, 3,4-epoxycyclohexylethyltrimethoxysilane, 3,4-epoxycyclohexylethyltriethoxysilane, $CF_3CH_2CH_2Si$ $(OCH_3)_3$, $C_2F_5CH_2CH_2Si$ $(OCH_3)_3$, $C_2F_5OCH_2CH_2CH_2Si$ $(OCH_3)_3$, $C_3F_7OCH_2CH_2CH_2Si$ $(OC_2H_5)_3$, $(CF_3)_2CHOCH_2CH_2CH_2Si$ $(OCH_3)_3$, $C_4FgCH_2OCH_2CH_2CH_2Si$ $(OCH_3)_3$, H $(CF_2)_4CH_2OCH_2CH_2CH_2Si$ $(OCH_3)_3$, 3-(perfluorocyclohexyloxy)propyltrimethoxysilane and so forth.

Examples of the compounds where x=2 include dimethyldimethoxysilane, dimethyldiethoxysilane, methylphenyldimethoxysilane, diethyldimethoxysilane, diethyldiethoxysilane, di-n-propyldimethoxysilane, di-n-propyldiethoxysilane, diisopropyldimethoxysilane, diisopropyldiethoxysilane, diphenyldimethoxysilane, divinyldiethoxysilane, $(CF_3CH_2CH_2)_2Si$ $(OCH_3)_2$, $(C_3F_7OCH_2CH_2CH_2)_2Si$ $(OCH_3)_2$, $[H(CF_2)_6CH_2OCH_2CH_2CH_2]_2Si$ $(OCH_3)_2$, $(C_2F_5CH_2CH_2)_2Si$ $(OCH_3)_2$ and so forth.

The polymer used in combination for the sol-gel reaction preferably has a hydrogen bond-forming group. Examples of the polymer having a hydrogen bond-forming group include polymers having a hydroxyl group and derivatives thereof (polyvinyl alcohol, polyvinyl acetal, ethylene-vinyl alcohol copolymer, phenol resin, methylol melamine etc. and derivatives thereof); polymers having a carboxyl group and derivatives thereof (homopolymers or copolymers containing units of a polymerizable unsaturated acid such as poly(meth) acrylic acid, maleic anhydride and itaconic acid, esters of these polymers (homopolymers or copolymers containing units of a vinyl ester such as vinyl acetate, (meth)acrylic acid ester such as methyl methacrylate or the like) etc.); polymers having an ether bond (polyalkylene oxide, polyoxyalkylene glycol, polyvinyl ether, silicon resin etc.); polymers having an amide bond (N-acylated polyoxazoline and polyalkyleneimine having a >N(COR)— bond (in the formula, R represents hydrogen atom, an alkyl group which may be substituted or an aryl group which may be substituted)); polyvinylpyrrolidine having a >NC(O)— bond and derivatives thereof; polyurethane having a urethane bond; polymers having a urea bond and so forth.

Hereafter, the reaction conditions for synthesis of materials forming the aforementioned gas barrier layer will be explained.

During the sol-gel reaction, the metal alkoxide is hydrolyzed and polycondensed in water or an organic solvent. For this reaction, it is preferable to use a catalyst. As the catalyst for hydrolysis, acids are generally used. As the acids, inorganic acids or organic acids may be used. Examples of the inorganic acids include hydrochloric acid, hydrogen bromide, hydrogen iodide, sulfuric acid, sulfurous acid, nitric acid, nitrous acid, phosphoric acid, phosphorous acid and so forth. Examples of the organic acids include carboxylic acids (formic acid, acetic acid, propionic acid, butyric acid, succinic acid, cyclohexanecarboxylic acid, octanoic acid, maleic acid, 2-chloropropionic acid, cyanoacetic acid, trifluoroacetic acid, perfluorooctanoic acid, benzoic acid, pentafluorobenzoic acid, phthalic acid etc.), sulfonic acids (methanesulfonic acid, ethanesulfonic acid, trifluoromethanesulfonic acid, p-toluenesulfonic acid, pentafluorobenzenesulfonic acid etc.), phosphoric acids and phosphonic acids (phosphoric acid dimethyl ester, phenylphosphonic acid etc.), Lewis acids (boron trifluoride etherate, scandium triflate, alkyltitanic acid, aluminic acid etc.), heteropolyacids (phosphomolybdic acid, phosphotungstic acid etc.) and so forth.

The amount of the acid used is 0.0001 to 0.05 mol, preferably 0.001 to 0.01 mol, per 1 mol of metal alkoxide (when alkoxysilane and other metal alkoxide are contained, alkoxysilane+other metal alkoxide).

After the hydrolysis, basic compounds such as inorganic bases and amines may be added to adjust pH of the solution to make it close to neutral so that condensation polymerization should be promoted.

As the inorganic bases, sodium hydroxide, potassium hydroxide, calcium hydroxide, magnesium hydroxide, aluminum hydroxide, ammonia and so forth can be used. As the organic base compounds, amines (ethylenediamine, diethylenetriamine, triethylenetetramine, tetraethylenepentamine, triethylamine, dibutylamine, N,N-dimethylbenzylamine, tetramethylethylenediamine, piperidine, piperazine, morpholine, ethanolamine, diazabicycloundecene, quinuclidine, aniline, pyridine etc.) and phosphines (triphenylphosphine, trimethylphosphine etc.) can be used.

Further, it is also preferable to use, after the hydrolysis with acids, in particular, amines described in Japanese Patent Application No. 2002-110061 and represented by the following formula.

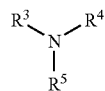

In the above formula, $R^3$ and $R^4$ each independently represent hydrogen atom, an aliphatic group, an acyl group, an aliphatic oxycarbonyl group, an aromatic oxycarbonyl group, an aliphatic sulfonyl group or an aromatic sulfonyl group, and $R^5$ represents an aromatic oxy group, an aliphatic thio group, an aromatic thio group, an acyloxy group, an aliphatic oxycarbonyloxy group, an aromatic oxycarbonyloxy group, a substituted amino group, a heterocyclic group or hydroxy group. However, when $R^5$ is not an aromatic group, either $R^3$ or $R^4$ or the both represent hydrogen atom.

In this case, a suitable addition amount of the amine is an equimolar amount to 100 times of the acid in mole, preferably an equimolar amount to 20 times in mole.

Further, other sol-gel catalysts can also be used in combination. Examples thereof will be shown below.

(1) Metal Chelate Compounds

Metal chelate compounds having a metal as the center metal and an alcohol represented by the formula $R^6OH$ (wherein $R^6$ represents an alkyl group having 1 to 6 carbon atoms) and a diketone represented as $R^7COCH_2COR^8$ (wherein $R^7$ represents an alkyl group having 1 to 6 carbon atoms, and $R^8$ represents an alkyl group having 1 to 6 carbon atoms or an alkoxy group having 1 to 16 carbon atoms) as ligands can be suitably used without any particular limitation. Two or more kinds of metal chelate compounds may be used in combination so long as they are in this category. Those having Al, Ti or Zr as the center metal are particularly preferred as the metal chelate compounds of the present invention. Those selected from a group of compounds represented by the formulas $Zr(OR^6)_{p1}(R^7COCHCOR^8)_{p2}$, $Ti(OR^6)_{q1}(R^7COCHCOR^8)_{q2}$ and $Al(OR^6)_{r1}(R^7COCHCOR^8)_{r2}$ are preferred, and they have an action of promoting the condensation reaction.

$R^6$ and $R^7$ in the metal chelate compounds may be identical or different, and represent an alkyl group having 1 to 6 carbon atoms, specifically, ethyl group, n-propyl group, isopropyl group, n-butyl group, sec-butyl group, tert-butyl group, n-pentyl group or the like. In addition to the aforementioned alkyl groups having 1 to 6 carbon atoms, $R^8$ also represents an alkoxy group having 1 to 16 carbon atoms, for example, methoxy group, ethoxy group, n-propoxy group, isopropoxy group, n-butoxy group, sec-butoxy group, tert-butoxy group, lauryl group, stearyl group or the like. In the metal chelate compounds, p1, p2, q1, q2, r1 and r2 are integers determined so as to obtain quadridentate or hexadentate ligands.

Specific examples of the metal chelate compounds include zirconium chelate compounds such as tri-n-butoxy(ethyl acetoacetate) zirconium, di-n-butoxy.bis(ethyl acetoacetate) zirconium, n-butoxy.tris(ethyl acetoacetate) zirconium, tetrakis(n-propyl acetoacetate) zirconium, tetrakis(acetyl acetoacetate) zirconium and tetrakis(ethyl acetoacetate) zirconium; titanium chelate compounds such as diisopropoxy•bis(ethyl acetoacetate) titanium, diisopropoxy•bis(acetyl acetate) titanium and diisopropoxy•bis(acetylacetone) titanium; aluminum chelate compounds such as diisopropoxy(ethyl acetoacetate) aluminum, diisopropoxy(acetyl acetonate) aluminum, isopropoxy•bis(ethyl acetoacetate) aluminum, isopropoxy•bis(acetyl acetonate) aluminum, tris(ethyl acetoacetate) aluminum, tris(acetyl acetonate) aluminum and monoacetyl acetonate•bis(ethyl acetoacetate) aluminum and so forth. Among these metal chelate compounds, tri-n-butoxy (ethyl acetoacetate) zirconium, diisopropoxy•bis(acetyl acetonate) titanium, diisopropoxy(ethyl acetoacetate) aluminum and tris(ethyl acetoacetate) aluminum are preferred. These metal chelate compounds can be used in each kind or two or more kinds of them can be mixed and used in combination. Further, partial hydrolysates of these metal chelate compounds can also be used.

(2) Organic Metal Compounds

Although preferred organic metal compounds are not particularly limited, organic transition metal compounds are preferred because of their high activity. Among these, tin compounds are particularly preferred since their stability and activity are favorable. Specific examples of these compounds include organic tin compounds including carboxylic acid type organic tin compounds such as $(C_4H_9)_2Sn$ $(OCOC_{11}H_{23})_2$, $(C_4H_9)_2Sn$ $(OCOCH=CHCOOC_4H_9)_2$, $(C_8H_{17})_2Sn$ $(OCOC_{11}H_{23})_2$, $(C_8H_{17})_2Sn$ (OCOCH═CHCOOC$_4$H$_9$)$_2$ and Sn(OCOCC$_8$H$_{17}$)$_2$; mercaptide type or sulfide type organic tin compounds such as (C$_4$H$_9$)$_2$Sn (SCH$_2$COOC$_8$H$_{17}$)$_2$, (C$_8$H$_{17}$)$_2$Sn (SCH$_2$CH$_2$COOC$_8$H$_{17}$)$_2$, (C$_8$H$_{17}$)$_2$Sn (SCH$_2$COOC$_{12}$H$_{25}$)$_2$,

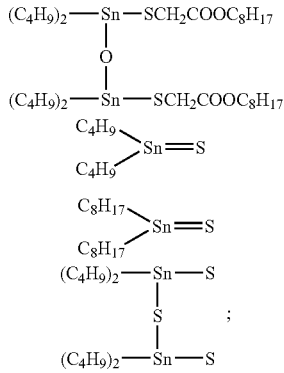

(C$_4$H$_9$)$_2$SnO, (C$_8$H$_{17}$)$_2$SnO and reaction products of an organic tin oxide such as (C$_4$H$_9$)$_2$SnO and (C$_8$H$_{17}$)$_2$SnO and an ester compound such as ethyl silicate, dimethyl maleate, diethyl maleate and dioctyl phthalate, and so forth.

(3) Metal Salts

As the metal salts, alkaline metal salts of organic acids (for example, sodium naphthenate, potassium naphthenate, sodium octanoate, sodium 2-ethylhexanoate, potassium laurate etc.) are preferably used.

Solvents used in the sol-gel reaction will be explained below. The solvents allow all ingredients in the sol solution to be uniformly mixed, thereby make it possible to prepare solid matter in the composition of the present invention and use it in various coating methods, and improve dispersion stability and storage stability of the composition. These solvents are not particularly limited so long as they can achieve the aforementioned objects. Preferred examples of the solvents include, for example, water and organic solvents showing high water-miscibility.

Examples thereof include tetrahydrofuran, dimethoxyethane, formic acid, acetic acid, methyl acetate, alcohols (methanol, ethanol, n-propyl alcohol, isopropyl alcohol, tert-butyl alcohol), ethylene glycol, diethylene glycol, triethylene glycol, ethylene glycol monobutyl ether, acetic acid ethylene glycol monoethyl ether, acetone, N,N-dimethylformamide, N,N-dimethylacetamide, dimethyl sulfoxide and so forth.

In order to adjust the sol-gel reaction rate, organic compounds that can constitute multidentate ligands may be added to stabilize the metal alkoxide. Examples thereof include β-diketones and/or β-ketoesters and alkanolamines.

Specific examples of the β-diketones and/or β-ketoesters include acetylacetone, methyl acetoacetate, ethyl acetoacetate, n-propyl acetoacetate, isopropyl acetoacetate, n-butyl acetoacetate, sec-butyl acetoacetate, tert-butyl acetoacetate, 2,4-hexanedione, 2,4-heptanedione, 3,5-heptanedione, 2,4-octanedione, 2,4-nonanedione, 5-methylhexanedione and so forth. Among these, ethyl acetoacetate and acetylacetone are preferred, and acetylacetone is particularly preferred. One kind of these β-diketones and/or β-ketoesters can solely be used, or two or more kinds of these can be mixed and used in combination.

When the aforementioned metal chelate compounds are used as sol-gel catalysts, these compounds that can be multidentate ligands can also be used to adjust the reaction rate.

The content of the polymer in the material which constitutes the aforementioned gas barrier layer is 3 to 97 weight %, preferably 5 to 65 weight %, with respect to the weight of the total solid content. Although the addition time of the polymer to the sol-gel reaction system is not particularly limited, it is preferably added until an early stage of the condensation reaction of the metal alkoxide in view of miscibility of them. More preferably, the polymer and the metal alkoxide are mixed before the start of the sol-gel reaction, i.e., before the addition of the acid catalyst.

The reaction temperature and time for the synthesis of the material which constitutes the aforementioned gas barrier layer are not particularly limited so long as the reaction system does not become heterogeneous, and they can be suitably adjusted depending on a combination of materials used, hydrolysis ratio of the organic polymer and condensation ratio of the metal alkoxide during the formation of the material which constitutes the desired gas barrier layer and so forth.

Hereafter, the gas barrier performance of the laminated film of the present invention will be explained.

In the laminated film of the present invention, a difference between oxygen transmission rate at 25° C. in relative humidity of 10% and oxygen transmission rate at 25° C. in relative humidity of 90% is within the range of 0 to $1.0 \times 10^{-5}$ ml/m$^2$•day•Pa, preferably 0 to $1.0 \times 10^{-6}$ ml/m$^2$•day•Pa, more preferably 0 to $5 \times 10^{-7}$ ml/m$^2$•day•Pa. If the difference in oxygen transmission rate at 25° C. in relative humidity of 10% and 90% is not more than $1.0 \times 10^{-5}$ ml/m$^2$•day•Pa, the oxidation degree of the internal portions are favorably maintained to be constant.

<Layer Structure>

The laminated film of the present invention has at least one gas barrier layer on a base material film. In the laminated film of the present invention, the thickness of the base material film is preferably 5 to 500 μm, more preferably 5 to 200 μm, further preferably 10 to 100 μm. If the base material film is too thin, the strength becomes insufficient, and handling thereof becomes difficult. If it becomes thicker, transparency tends to be reduced, and flexibility tends to be degraded.

In the laminated film of the present invention, the thickness of the gas barrier layer is 0.01 to 10 μm, preferably 0.1 to 10 μm, more preferably 0.1 to 1 μm. If the thickness of the gas barrier layer is 0.01 μm or less, sufficient gas barrier performance may not be obtained. On the other hand, if it becomes thicker than 10 μm, cracks may be generated at the time of drying, and hence the barrier performance may be degraded.

The laminated film of the present invention may also have two or more of the aforementioned gas barrier layers. Further, the laminated film of the present invention may have at least one gas barrier layer between at least two of the base material films. By employing a structure where both sides of the gas barrier layer are laminated with base material films, gas barrier performance superior to that of the laminated film having the gas barrier layer on the base material film can be obtained.

The laminate film of the present invention may have an inorganic thin film layer between the base material film and the gas barrier layer. As such an inorganic thin film layer, an inorganic vapor deposition layer of silica, zirconia, alumina or the like is preferred. The inorganic vapor deposition layer can be formed by vacuum vapor deposition, sputtering method or the like.

The laminated film of the present invention may have, for example, the following layer structures, wherein the base material film is represented by S, the gas barrier layer is represented by B, and the inorganic thin film layer is represented by N. The structure of S/B, wherein the gas barrier layer is provided on the base material film, is more preferred.

S/B
S/N/B
S/N/B/S
S/B/S/B/S

[Production Method of the Present Invention]

In the production method of the present invention, a solution containing at least one kind of metal alkoxide and a polymer having a hydrogen bond-forming group is applied on the base material film and then irradiated with an electromagnetic wave to form a gas barrier layer.

In the production method of the present invention, a solution containing at least one kind of metal alkoxide and a polymer having a hydrogen bond-forming group (hereafter referred to as a "sol solution"), is first applied on a base material film to coat a gas barrier layer by a sol-gel method.

As the metal alkoxide and the polymer having a hydrogen bond-forming group used in the production method of the present invention, those explained for the laminate film of the present invention can be used.

Further, in the production method of the present invention, coating of the material for forming the gas barrier layer can be performed by forming a thin film on the base material film using a coating method such as curtain flow coating, dip coating, spin coating or roll coating. In this case, the time of hydrolysis may be at any time during the production process. For example, there can be suitably used a method in which a solution having a required composition is hydrolyzed and partially condensed to prepare a desired sol solution beforehand, and then it is applied and dried, a method in which a solution having a required composition is prepared and applied and dried while being simultaneously hydrolyzed and partially condensed, a method in which, after a solution is coated and primarily dried, a water-containing solution necessary for hydrolysis is overlaid to attain the hydrolysis, and so forth. Further, various application methods can be used. When productivity is emphasized, a method in which the discharge flow rates of a lower layer coating solution and an upper layer coating solution are adjusted in a slide geeser having multiple discharge ports so that required coating amounts of the solutions should be obtained, and the formed multilayer flows are continuously placed on the base material film and dried (simultaneous multilayer coating method) is preferably used.

In the production method of the present invention, the sol solution is applied on the base material film, and then an electromagnetic wave is irradiated on the coated film to form a gas barrier layer.

The electromagnetic wave that is irradiated on the coated film is not particularly limited, and it may be any of an electron ray, ionic ray and low temperature plasma. If influence on deformation and denaturation of the base material film and well balanced progress of the polycondensation of the metal alkoxide hydrolysate and evaporation of the solvent and byproducts are taken into consideration, a microwave can be particularly preferably used.

The microwave to be used is defined as an electromagnetic wave having a frequency of 300 MHz to 300 GHz. Although the microwave used in the present invention may be a microwave having any frequency within the defined range, it is preferably a microwave having a frequency of 1000 MHz to 10 GHz, more preferably 1500 to 3000 MHz, further preferably 2450 MHz.

Further, although the output of the microwave used for the present invention can be arbitrarily selected in the range of performance of commercially available apparatuses, a larger output does not necessarily lead to improvement of the gas barrier property or shortening of the film formation time, and it is preferably in the range of 200 to 2000 W, more preferably 200 to 1000 W, most preferably 400 to 800 W. Although the irradiation time may vary depending on the radiation output, it is preferably 10 to 300 seconds, more preferably 10 to 120 seconds, particularly preferably 10 to 60 seconds from economical viewpoint, for the above-defined range of the irradiation output. If the irradiation time is shorter than 10 seconds, the effect of the irradiation markedly decreases. If the irradiation time exceeds 300 seconds, temperature of the film increases, and bad influences are observed such as deformation of the film. Although the microwave may be irradiated intermittently, continuous irradiation is more preferred. The irradiation temperature can be selected from the range of from room temperature to the deformation temperature of the base material film without any particular limitation, and it is preferably 30 to 150° C., particularly preferably 50 to 130° C.

The irradiation intensity of the microwave is preferably 30 to 500 mJ/cm$^2$, more preferably 50 to 400 mJ/cm$^2$.

In the production method of the present invention, the irradiation of the electromagnetic wave is preferably performed during a period immediately after the application of the sol solution on the base material film and before completion of the drying, and the irradiation is more preferably performed immediately after the application. Although the irradiation time is not particularly limited, it is preferably 5 seconds to 10 minutes, more preferably 5 seconds to 3 minutes. By the irradiation of the electromagnetic wave during a step after the application of the sol solution and before the drying, a gas barrier layer having a uniform and dense structure can be obtained. Although the reason for this is not clear at present, it is estimated that if an electromagnetic wave is irradiated on a coated film before drying, temperature rise is caused due to vibration of molecules resulting from polarization at a molecular level, and unreacted portions in which the solvent remains and molecular movements occur at a relatively high level are selectively heated, and water generated by the condensation reaction is selectively heated to promote evaporation thereof, resulting in the formation of the uniform and dense structure.

The inventors of the present invention measured solid proton NMR spectra of a gas barrier film formed with irradiation of a microwave and a gas barrier film produced without irradiation of a microwave. As a result, it was confirmed that the line widths of spectra were broadened by the irradiation of microwave. This indicates that the molecular movements were lowered by the irradiation of microwave and conforms to the aforementioned estimation.

In the production method of the present invention, besides the aforementioned microwave, a low temperature plasma, ionic ray and electron ray can be irradiated. This is because irradiation of these can directly give energy for activating the condensation reaction to the reaction sites in which the solvent remains and molecular movements occur at a relatively high level, and thereby the polycondensation of the metal alkoxide hydrolysate becomes likely to advance.

When electron ray irradiation is used with a known electron radiation crosslinkable resin as an organic component, crosslinking of the organic component advances simultaneously with the polycondensation of the metal alkoxide hydrolysate, and thus it becomes easy to obtain a dense film structure in which molecular chains are intertwined with one another. Examples of the electron radiation crosslinkable resin include polyvinyl alcohol, polyoxazoline, polyvinylpyrrolidone and so forth.

Similar effects can also be obtained by ultraviolet irradiation used with a known ultraviolet radiation/electron radiation curing resin and a known photopolymerization initiator as the organic component and electron ray irradiation used with a known ultraviolet radiation/electron radiation curing resin as the organic component. Examples of the ultraviolet radiation/electron radiation curing resin include epoxy acrylate, urethane acrylate, glycerol polyglycidyl ether and so forth. Examples of the photopolymerization initiator include, for example, benzophenone, diethoxyacetophenone, Sun-Aid SI-100L produced by SanShin Chemical Industry and so forth.

In the production method of the present invention, at the same time as the irradiation of at least one of the aforementioned electromagnetic wave, electron ray, ionic ray and low temperature plasma and/or after the irradiation, the coated film is desirably subjected to a drying treatment using a known drying method. Specifically, the hot roll contacting method, heat medium (air, oil) contacting method, infrared heating method and so forth can be mentioned, and the heated air contacting method and infrared drying method are particularly preferred in view of drying efficiency. Although the temperature for drying is not particularly limited so long as the base material film should not be deformed, it is preferably 150° C. or lower, more preferably 30 to 150° C. particularly preferably 50 to 130° C., for the heated air contacting method. When the infrared drying method is employed, conditions providing a drying surface temperature of 120 to 150° C. are preferred.

In the production method of the present invention, gas barrier layers of the obtained gas barrier laminate films can be further bonded to each other to form a gas barrier laminate film. That is, by bonding two of laminate films obtained by the production method of the present invention to each other so that the gas barrier layers should face each other, a laminated film having the base material films outside can be obtained.

Image Display Device

The image display device of the present invention is a liquid crystal device, organic EL device or the like utilizing the laminate film of the present invention.

The organic EL device having the laminate film of the present invention is preferably used according to, for example, any of the embodiments described in Japanese Patent Laid-open Publication Nos. 11-335661, 11-335368, 2001-192651, 2001-192652, 2001-192653, 2001-335776, 2001-247859, 2001-181616 and 2001-181617, Japanese Patent Application Nos. 2001-58834, 2001-58835, 2001-89663 and 2001-334858.

That is, in an organic EL device having the laminate film of the present invention, the laminate film of the present invention can be used as a base material film and/or a protective film. In the organic EL device of the present invention, the gas barrier film formed by the sol-gel method is preferably coated on the organic EL layer side, i.e., the side that is not brought into contact with outside air.

The laminate film of the present invention and the substrate comprising the laminate film are especially useful as electrode substrates of image display devices such as liquid crystal display devices and organic EL devices. In addition, they can also be applied to, for example, electrode substrates also serving as polarizing plates, electrode substrate also serving as phase plates, films with transparent electrodes for touch panels, electromagnetic wave-shielding plates for CRT, plasma display panels (PDP), backlights, light guide panels, color filters, optical guards, optical tapes, optical discs, covers and active devices of solar cells and so forth. Furthermore, they can also be applied to packaging materials for foodstuffs, drugs and so forth.

EXAMPLES

Hereafter, the laminate film of the present invention, production method therefor, substrate and image display device comprising the laminate film will be further explained in detail.

The materials, amounts, ratios, types and procedures of treatments and so forth shown in the following examples can be suitably changed unless such changes depart from the spirit of the present invention. Accordingly, the scope of the present invention should not be construed as limited to the following specific examples.

Example 1

1. Preparation of Resin Layer (Base Material Film)

ZEONOA 1600R (Tg: 163° C., cycloolefin polymer produced by Nippon Zeon) was mixed per 100 parts by weight with 10 parts by weight of Somasif MTE (synthetic mica produced by CO-OP CHEMICAL), then kneaded and extruded at 270° C. by using a double screw extruder (Rheomix 600P/PTW25, HAAKE, Germany) to obtain Resin layer 1A having a thickness of 200 µm. In the same manner as described above except that the content of Somasif MTE was changed as shown in Table 1, Resin layers 1B and 1C were prepared. A resin layer not containing Somasif MTE was also prepared as Resin layer 1D.

2. Preparation of Gas Barrier Layer

In an amount of 8 g of SOARNOL D2908 (ethylene/vinyl alcohol copolymer produced by Nippon Synthetic Chemical Industry) was dissolved in a mixed solvent of 118.8 g of 1-propanol and 73.2 g of water at 80° C. In an amount of 10.72 g of this solution was added and mixed with 2.4 ml of 2 mol/L hydrochloric acid. This solution was added dropwise with 1 g of tetraethoxysilane with stirring and further stirred for 30 minutes. Then, the obtained application solution was added with dimethylbenzylamine as a pH modifier immediately before application and applied to Resin layers 1A to 1D mentioned above by using a wire bar.

Immediately after the application, each coated layer was irradiated with a microwave of 500 W and 2450 MHz using a microwave generating apparatus with the conditions shown in Table 2 and dried at 120° C. for 5 minutes to form a gas barrier layer having a thickness of about 1 µm on each of Resin layers 1A to 1D mentioned above. These are designated Films 2Aa, 2Ab, 2B, 2C, 2Da and 2Db.

Further, instead of the microwave used for Film 2Db, an electron ray with an acceleration energy of 30 keV was irradiated for 0.5 second on the whole surface of the film by using a low energy EB apparatus to produce Film 2E. Further, for comparison, Films 2F to 2I not irradiated with a microwave after coating and Films 2Ac and 2Dc irradiated with a microwave for 60 seconds after drying under the aforementioned conditions, not immediately after the application, were also prepared.

Further, PVA is applied on Resin layer 1D instead of the sol-gel layer in the same thickness to prepare Film 2J.

3. Bonding of Films

The gas barrier layers of Films 2Ab, 2B, 2C, 2Db and 2I, on which gas barrier layers were formed as described above, were bonded by lamination to produce Films 3Ab, 3B, 3C, 3Db and 3I, respectively.

As comparative examples, two of Films 1A, two of Films 2F, two of Films 2Ac, and two of Films 2Dc were bonded to each other, respectively, to produce gas barrier films, and designated Films 3K, 3F, 3Ac and 3Dc, respectively.

Test Example 1

Heat Resistance Test (Measurement of Tq)

Tg of Resin layer 2Aa, among the resin layers produced as base material films, was measured by the dynamic tension viscoelasticity test method. As a result, Tg of Resin layer Aa was 168° C. From this result, it can be seen that Tg of the resin layer containing the inorganic layered silicate (Resin layer 2Aa) among the resin layers used for the present invention was increased compared with the resin layer not containing the inorganic layered silicate (Resin layer lDa, Tg: 163° C.), and thus heat resistance was improved.

That is, it was found that a resin layer prepared by adding an organic layered silicate to a resin having a high Tg was effective for obtaining higher heat resistance.

Test Example 2

Measurement of Gas Barrier Property

The gas transmission rates of Films 2Aa to 3I were measured at 25° C. under atmospheres of relative humidities of 10% and 90% for 24 hours by using PERMATRAN W1A produced by MOCON, and a difference of them was calculated. The results are shown in Table 1.

TABLE 1

| Film | Somasif MET content (per 100 weight parts of resin) | Type of irradiated ray | Irradiation condition | Bonding | Difference of oxygen transmission rates at 10% and 90% RH ($10^{-5}$ ml/m$^2$ · day · Pa) | Note |
| --- | --- | --- | --- | --- | --- | --- |
| 2Aa | 10 parts by weight | Microwave | 10 seconds immediately after application | None | 0.04 | Invention |
| 2Ab | 10 parts by weight | Microwave | 60 seconds immediately after application | None | 0.03 | Invention |
| 2Ac | 10 parts by weight | Microwave | 60 seconds immediately before completion of drying | None | 0.90 | Invention |
| 2B | 20 parts by weight | Microwave | 10 seconds immediately after application | None | 0.64 | Invention |
| 2C | 30 parts by weight | Microwave | 10 seconds immediately after application | None | 0.63 | Invention |
| 2Da | None | Microwave | 10 seconds immediately after application | None | 0.88 | Invention |
| 2Db | None | Microwave | 60 seconds immediately after application | None | 0.80 | Invention |
| 2Dc | None | Microwave | 60 seconds immediately before completion of drying | None | 0.96 | Invention |
| 2E | None | Electron ray | 0.5 second immediately after application | None | 0.51 | Invention |
| 2F | 10 parts by weight | None | — | None | 102 | Comparative |
| 2G | 20 parts by weight | None | — | None | 95 | Comparative |
| 2H | 30 parts by weight | None | — | None | 89 | Comparative |
| 2I | None | None | — | None | 120 | Comparative |
| 2J | None | Microwave | 0.5 second immediately after application | None | 320 | Comparative |
| 3Ab | 10 parts by weight | Microwave | 60 seconds immediately after application | Bonded | 0.08 | Invention |
| 3Ac | 10 parts by weight | Microwave | 60 seconds immediately before completion of drying | Bonded | 0.98 | Invention |
| 3B | 20 parts by weight | Microwave | 10 seconds immediately after application | Bonded | 0.08 | Invention |
| 3C | 30 parts by weight | Microwave | 10 seconds immediately after application | Bonded | 0.08 | Invention |
| 3Db | None | Microwave | 10 seconds immediately after application | Bonded | 0.09 | Invention |
| 3Dc | None | Microwave | 60 seconds immediately before completion of drying | Bonded | 0.99 | Invention |
| 3F | 10 parts by weight | None | — | Bonded | 24 | Comparative |
| 3I | None | None | — | Bonded | 74 | Comparative |
| 3K | 10 parts by weight | — | — | Bonded | 283 | Comparative |

As seen from the results shown in Table 1, all of the gas barrier laminate films produced by the production method of the present invention showed a difference of oxygen transmission rates at relative humidities of 10% and 90% smaller than $1.0 \times 10^{-5}$ ml/m$^2 \cdot$day$\cdot$Pa. Further, when a microwave or electron ray was irradiated during a period immediately after application of an application solution on a base material and before completion of drying, a further smaller difference in oxygen transmission rate was obtained. As for the time of the irradiation, irradiation immediately after the application provided a smaller difference in oxygen transmission rate compared with irradiation immediately before completion of the drying. Furthermore, as for the irradiation time of electromagnetic wave, irradiation of 60 seconds provided more favorable difference in oxygen transmission rate compared with irradiation of 10 seconds.

Further, when the sol solution was coated on the base material film, the difference in oxygen transmission rate was markedly reduced compared with the case where the PVA solution was coated.

From the above results, it can be seen that all of the gas barrier laminate films produced by the production method of the present invention showed favorable gas barrier performance even in high humidity (difference of oxygen transmission rates at relative humidities of 10% and 90% is $1.0 \times 10^{-5}$ ml/m$^2 \cdot$day$\cdot$Pa or less).

Example 2

Production of Substrate and Organic EL Device

Film 3Ab was introduced into a vacuum chamber, and a transparent electrode composed of an ITO thin film having a thickness of 0.2 μm was formed by DC magnetron sputtering using an ITO target. An aluminum lead wire was connected to the transparent electrode (ITO) to form a laminated structure.

An aqueous dispersion of polyethylene dioxythiophene/polystyrenesulfonic acid (Baytron P, BAYER, solid content: 1.3 weight %) was applied on the surface of the transparent electrode by spin coating and vacuum-dried at 150° C. for 2 hours to form a hole transporting organic thin film layer having a thickness of 100 nm. This was designated Substrate X.

Further, a coating solution for light-emitting organic thin film layer having the following composition was applied on one side of a temporary support made of polyethersulfone having a thickness of 188 μm (SUMILITE FS-1300, Sumitomo Bakelite) by using a spin coater and dried at room temperature to form a light-emitting organic thin film layer having a thickness of 13 nm on the temporary support. This was designated Transfer Material Y.

| | |
|---|---|
| Polyvinyl carbazole (Mw = 63000, Aldrich) | 40 parts by weight |
| Tris(2-phenylpyridine) iridium complex (Ortho-metalated complex) | 1 part by weight |
| Dichloroethane | 3200 parts by weight |

The light-emitting organic thin film layer side of Transfer Material Y was overlaid on the upper surface of the organic thin film layer of Substrate X mentioned above, heated and pressurized at 160° C., 0.3 MPa and 0.05 m/min by using a pair of heat rollers, and the temporary support was delaminated to form a light-emitting organic thin film layer on the upper surface of Substrate X. This was designated Substrate XY.

Further, a patterned mask for vapor deposition (mask providing a light-emitting area of 5 mm×5 mm) was set on one side of a polyimide film (UPILEX-50S, Ube Industries) cut into a 25-mm square and having a thickness of 50 μm, and Al was vapor-deposited in a reduced pressure atmosphere of about 0.1 mPa to form an electrode having a film thickness of 0.3 μm. An aluminum lead wire was connected to the Al electrode to form a laminated structure. A coating solution for an electron transporting organic thin film layer having the following composition was applied on the obtained laminated structure by using a spin coater and vacuum-dried at 80° C. for 2 hours to form an electron transporting organic thin film layer having a thickness of 15 nm on LiF. This was designated Substrate Z.

| | |
|---|---|
| Polyvinyl butyral (Mw = 2000, 2000L produced by Denki Kagaku Kogyo) | 10 parts by weight |
| Electron transporting compound having the following structure | 20 parts by weight |
| 1-Butanol | 3500 parts by weight |

Substrate XY and Substrate Z were stacked so that the electrodes should face each other via the light-emitting organic thin film layer between them, heated and pressurized at 160° C., 0.3 MPa and 0.05 m/min by using a pair of heat rollers to obtain Organic EL Device 1.

As comparative organic EL devices, Organic EL Devices 2 and 3 was obtained in the same manner as that described above except that Films 3Ac and 3F were used respectively as the base material film instead of Film 3Ab in the production of Substrate X.

DC voltage was applied to the obtained Organic EL Devices 1 to 3 by using Source-Measure Unit Type 2400 (Toyo Corporation) to allow them to emit light. Both of Organic EL Devices 1 and 2 favorably emitted light. After the production of Organic EL devices 1 and 2, they were left at 40° C. and relative humidity of 90% for 10 days, and similarly applied with DC voltage. As a result, Organic EL device 1 similarly showed favorable light emission, whereas defect portions for light emission increased in Organic EL devices 2 and 3.

Effects of low temperature plasma treatment and ion ray irradiation treatment were similarly examined. As a result, it was confirmed that they had similar effects.

As explained above, the gas barrier laminate film of the present invention has extremely high gas barrier ability represented by a difference in oxygen transmission rate of 0 to $1.0 \times 10^{-5}$ ml/m²·day·Pa at 25° C. in relative humidity of 10% and 90%. Therefore, the gas barrier laminate film of the present invention shows superior gas barrier property even in high humidity. Further, a substrate and image display device utilizing the gas barrier laminate film of the present invention show superior gas barrier property even in high humidity, and therefore they show high precision and high durability.

Further, in the production method of the present invention, hydrolysate of at least one kind of metal alkoxide and a hydrophilic resin are applied, and an electromagnetic wave is irradiated on the coated film after the formation of the coated film, preferably during a period immediately after the application and before completion of drying, to form a gas barrier layer. By these steps, the production method of the present invention can provide a dense gas barrier laminate film having superior gas barrier property.

The present disclosure relates to the subject matter contained in Japanese Patent Application No. 093738/2003 filed Mar. 31 2003, which is expressly incorporated herein by reference in its entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A gas barrier laminate film comprising a base material film and at least one gas barrier layer obtained by a sol-gel method, wherein a difference between oxygen transmission rate at 25° C. in relative humidity of 10% and oxygen transmission rate at 25° C. in relative humidity of 90% is within the range of 0 to $1.0 \times 10^{-5}$ ml/m2·day·Pa and the gas barrier layer is an organic/inorganic hybrid layer is formed by using a polymer having a hydrogen bond-forming group.

2. The gas barrier laminate film according to claim 1, wherein a difference between oxygen transmission rate at 25° C. in relative humidity of 10% and oxygen transmission rate at 25° C. in relative humidity of 90% is within the range of 0 to $1.0 \times 10^{-6}$ ml/m2·day·Pa.

3. The gas barrier laminate film according to claim 1, wherein the base material film contains a layered compound.

4. The gas barrier laminate film according to claim 1, wherein the base material film is constituted by a polymer having a glass transition temperature of 130 to 300° C.

5. The gas barrier laminate film according to claim 1, wherein the hydrogen bond-forming group is hydroxyl group.

6. The gas barrier laminate film according to claim 1, wherein the base material film has a thickness of 5 to 500 μm.

7. The gas barrier laminate film according to claim 6, wherein the gas barrier layer has a thickness of 0.001 to 10 μm.

8. The gas barrier laminate film according to claim 1, which comprises at least one gas barrier between at least two base material films.

9. A substrate containing the gas barrier laminate film according to claim 1.

10. An image display device comprising the gas barrier laminate film according to claim 1.

11. The image display device according to claim 10, which is an organic EL device.

12. A method for producing a gas barrier laminate film, obtained by a sol-gel method, which comprises applying a solution containing at least one kind of metal alkoxide and a polymer having a hydrogen bond-forming group on a base material film and irradiating the solution with an electromagnetic wave to form a gas barrier layer, wherein a difference between oxygen transmission rate at 25° C. in relative humidity of 10% and oxygen transmission rate at 25° C. in relative humidity of 90% is within the range of 0 to $1.0 \times 10^{-5}$ ml/m2·day·Pa and the gas barrier layer is an organic/inorganic hybrid layer and is formed by using a polymer having a hydrogen bond-forming group.

13. The method for producing a gas barrier laminate film according to claim 12, wherein an alkoxysilane is used as the metal alkoxide.

14. The method for producing a gas barrier laminate film according to claim 12, wherein at least one kind of electromagnetic wave selected from the group consisting of electron rays, ionic rays and low temperature plasmas is used as the electromagnetic wave.

15. The method for producing a gas barrier laminate film according to claim 12, wherein a microwave is used as the electromagnetic wave.

16. The method for producing a gas barrier laminate film according to claim 12, wherein the electromagnetic wave is irradiated during a period immediately after completion of the application of the solution and before completion of drying of the solution.

17. The method for producing a gas barrier laminate film according to claim 12, wherein the electromagnetic wave is irradiated for 5 seconds to 3 minutes immediately after the application of the solution.

18. The method for producing a gas barrier laminate film according to claim 12, which comprises applying a solution containing at least one kind of metal alkoxide and a polymer having a hydrogen bond-forming group on a base material film and irradiating the solution with an electromagnetic wave to form two films, and bonding gas barrier layers of the films to each other.

* * * * *